United States Patent
Sung

(10) Patent No.: US 9,257,345 B2
(45) Date of Patent: Feb. 9, 2016

(54) ANTI-FUSE ARRAY OF SEMICONDUCTOR DEVICE AND METHOD FOR FORMING THE SAME

(71) Applicant: SK hynix Inc., Icheon (KR)

(72) Inventor: Min Chul Sung, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/638,929

(22) Filed: Mar. 4, 2015

(65) Prior Publication Data

US 2015/0179526 A1 Jun. 25, 2015

Related U.S. Application Data

(63) Continuation of application No. 13/843,282, filed on Mar. 15, 2013, now Pat. No. 9,000,560.

(30) Foreign Application Priority Data

Dec. 28, 2012 (KR) .................. 10-2012-0156320

(51) Int. Cl.
| | |
|---|---|
| *H01L 23/52* | (2006.01) |
| *H01L 21/8234* | (2006.01) |
| *H01L 23/525* | (2006.01) |
| *H01L 21/66* | (2006.01) |
| *H01L 27/112* | (2006.01) |
| *H01L 27/118* | (2006.01) |

(52) U.S. Cl.
CPC ........ *H01L 21/823475* (2013.01); *H01L 22/22* (2013.01); *H01L 23/5252* (2013.01); *H01L 27/11206* (2013.01); *H01L 27/11803* (2013.01); *H01L 2924/0002* (2013.01)

(58) Field of Classification Search
CPC .................. H01L 23/5252; H01L 27/11206
USPC ........................................... 257/530
See application file for complete search history.

(56) References Cited

U.S. PATENT DOCUMENTS

| 7,623,368 | B2 | 11/2009 | Luan | |
|---|---|---|---|---|
| 8,179,709 | B2 * | 5/2012 | Ogawa .................. | G11C 17/16 257/50 |
| 8,283,751 | B2 * | 10/2012 | Kurjanowicz ................ | 257/530 |
| 8,514,606 | B2 * | 8/2013 | Chung ............... | G11C 11/1659 365/100 |
| 2008/0246098 | A1 * | 10/2008 | Kurjanowicz .......... | G11C 17/16 257/408 |
| 2009/0267160 | A1 * | 10/2009 | Ichise ........................ | 257/369 |
| 2012/0051164 | A1 | 3/2012 | Son et al. | |
| 2012/0199943 | A1 * | 8/2012 | Ogawa ......................... | 257/530 |
| 2012/0313180 | A1 * | 12/2012 | Mitchell et al. ............... | 257/368 |

FOREIGN PATENT DOCUMENTS

| KR | 10-1999-0042446 A | 6/1999 |
|---|---|---|
| KR | 10-2000-0027654 A | 5/2000 |
| KR | 10-2012-0020272 A | 3/2012 |

* cited by examiner

*Primary Examiner* — David Vu
*Assistant Examiner* — Brandon Fox

(57) ABSTRACT

An anti-fuse array of a semiconductor device and a method for forming the same are disclosed. The anti-fuse array for a semiconductor device includes a first-type semiconductor substrate formed to define an active region by a device isolation region, a second-type impurity implantation region formed in the active region, a first-type channel region isolated from the semiconductor substrate by the second-type impurity implantation region, a gate electrode formed over the channel region, and a first metal contact formed over the second-type impurity implantation region.

10 Claims, 14 Drawing Sheets

ANTI-FUSE ARRAY OF SEMICONDUCTOR DEVICE AND METHOD FOR FORMING THE SAME

CROSS-REFERENCE TO RELATED APPLICATION

This application is a continuation of U.S. application Ser. No. 13/843,282 filed on Mar. 15, 2013, which claims priority to Korean patent application No. 10-2012-0156320 filed on 28 Dec. 2012, the disclosures of which are hereby incorporated in their entirety by reference.

BACKGROUND

Embodiments relate to an anti-fuse array of a semiconductor device and a method for forming the same, and more particularly to a technology for manufacturing an array anti-fuse.

In recent times, as information media such as computers have rapidly come into widespread use, technology of a semiconductor device has been rapidly developed. Functionally, it is necessary for a semiconductor device to operate at a high speed and to have a high storage capacity. Therefore, technology for manufacturing semiconductor devices has rapidly developed to improve an integration degree, reliability, a response speed, etc.

A process for manufacturing semiconductor devices includes a fabrication (FAB) process that forms cells, each having integrated circuits by stacking predetermined circuit patterns on a silicon substrate, and an assembly process that packages the substrate into unit cells. An Electrical Die Sorting (EDS) process for testing electrical characteristics of cells formed over the substrate is performed between the FAB process and the assembly process.

The above-mentioned EDS process determines whether the cells formed over the substrate are in an electrically good condition, or are defective. The EDS process removes defective cells before the assembly process, such that efforts or costs consumed in the assembly process may be reduced. As a result, defective cells may be detected by the EDS process in early stages of manufacture and repaired.

Repair processes may be performed as follows.

In order to increase a production yield of the semiconductor device in which a defect has occurred in the fabrication process, a redundant cell is added as a substitute for a defective cell. A fuse for coupling the redundant cell to the integrated circuit is also added in the manufacturing process of the semiconductor device. The repair process replaces the defective cell with the redundant cell in the chip using a fuse for cell recovery. That is, the repair process cuts a specific fuse coupled to the redundant cell, so that a connection originally coupled to the defective cell can be redirected to the redundant cell.

However, although the repair process for repairing defective cells at a wafer level is performed, a 1-bit or 2-bit defect can still unexpectedly occur at a wafer level after execution of the packaging process. An error rate after packaging is about 10%. Thus, an additional repair process may occur after execution of the packaging process. However, since it is difficult to use a laser repair device after completion of the packaging process, there is needed a new fuse different from that of the repair process performed before the packaging process.

The fuse for use in the repair process after the packaging process will hereinafter be described in detail.

The fuse used after the packaging process is generally called an anti-fuse that performs repairing through interconnection instead of disconnection. A fuse used before the packaging process is designed to perform repairing through such disconnection. That is, the term "anti-fuse" is a relative meaning with respect to the fuse used before the packaging process. The anti-fuse is electrically opened at a normal state. However, if a high voltage is applied to the anti-fuse at the normal state to rupture an insulator contained conductors of the anti-fuse, the anti-fuse is coupled to a cell. The anti-fuse is formed in a periphery region (or a peripheral circuit region), and redundant cells for the anti-fuse are also formed in the periphery region, and such redundant cells may be formed as SRAM cells that do not require refresh operation.

The anti-fuse has a variety of advantages. For example, the anti-fuse may allow the repair process to be performed at a package level, may increase a number of net dies, may improve product characteristics, and may overcomes a limitation due to high dependence on device and fabrication which can be found in a conventional laser fuse. Because of the above-mentioned characteristics of the anti-fuse, it is expected that the anti-fuse will be widely used in various technical fields. For the anti-fuse to stably operate, it is important to securely rupture the insulator.

SUMMARY

Various embodiments are directed to providing an anti-fuse array of a semiconductor device and a method for manufacturing the same that substantially obviate one or more problems due to limitations and disadvantages of the related art.

An embodiment relates to a semiconductor device including an anti-fuse array comprising a single transistor and a method for manufacturing the same. In accordance with an aspect, an anti-fuse array for a semiconductor device includes: a first-type semiconductor substrate formed to define an active region by a device isolation region; a second-type impurity implantation region formed in the active region; a first-type channel region isolated from the semiconductor substrate by the impurity implantation region; a gate electrode formed over the channel region; and a first metal contact formed over the second-type impurity implantation region.

The anti-fuse array may further include a second metal contact formed over the gate electrode.

The anti-fuse array may further include: a bit line coupled to the first metal contact; and a word line coupled to the second metal contact.

The second-type impurity implantation region may be formed as a U-shape.

The anti-fuse array may further include: a gate insulation film disposed between the channel region and the gate electrode.

When a potential difference between the second-type impurity implantation region and the channel region is equal to or higher than a predetermined potential difference, the gate insulation film may be ruptured.

After the gate insulation film is ruptured, when the channel region has a high potential, a current path from the channel region to the impurity implantation region may be formed. The first type is P type, and the second type is N type.

In accordance with another aspect, an anti-fuse array for a semiconductor device includes: a first-type semiconductor substrate formed to define an active region by a device isolation region; second-type first and second impurity implantation regions formed in the active region and along sidewalls of the device isolation region; a gate electrode formed over an active region and disposed between the first and second impurity implantation regions; and a first metal contact formed over the first impurity implantation region.

The anti-fuse array may further include: a gate insulation film disposed between the first-type semiconductor substrate in the active region and the gate electrode; a second metal contact formed over the gate electrode; a bit line coupled to the first metal contact; and a word line coupled to the second metal contact. The first-type is P type, and the second-type is N type.

When the gate insulation film is ruptured by a potential difference applied to the first metal contact and the second metal contact, a PN junction between the first impurity implantation region and the active region formed below the gate electrode may be formed.

In accordance with another aspect, a method for manufacturing an anti-fuse array of a semiconductor device includes: forming an active region in a first-type semiconductor substrate by a device isolation region; depositing a gate insulation film and a gate electrode over the active region; forming a spacer film over a sidewall of the gate electrode; forming second-type first and second impurity implantation regions, using the gate electrode and the gate spacer film as a mask, in the active region and along a sidewall of the device isolation region; and forming a first metal contact over the first impurity implantation region.

The method may further include: prior to the forming of the gate insulation film and the gate electrode, forming a third impurity implantation region extending perpendicular to the first and second impurity implantation regions in the active region and between the second-type first and second impurity implantation regions.

The method may further include: forming the second metal contact over the gate electrode; forming a bit line coupled to the first metal contact; and forming a word line coupled to the second metal contact.

The gate electrode may not overlap with the first and second impurity implantation regions.

The second metal contact may be formed simultaneously with the first metal contact.

The forming of the first metal contact may include: depositing an interlayer insulation film over the gate electrode and the semiconductor substrate; forming a first metal contact hole exposing the first impurity implantation region by etching the interlayer insulation film; forming a second metal contact hole exposing an upper part of the gate electrode by etching the interlayer insulation film; and forming the first metal contact and the second metal contact by filling a conductive material in the first metal contact hole and the second metal contact hole.

In accordance with an aspect, an anti-fuse array for a semiconductor device includes: a first junction region serving as a channel region and doped with a first dopant; a second junction region doped with a second dopant and configured to form a PN junction with the first junction region; a single gate electrode coupled to the first junction; and a plurality of conductive (bit line) contacts coupled to the second junction region, wherein the plurality of conductive contacts are configured to be coupled to the single gate electrode under a fuse repair condition.

A unit cell of the anti-fuse array includes a single transistor, and wherein the single transistor includes: the single gate electrode, and one of the plurality of conductive (bit line) contacts.

A unit cell of the anti-fuse array includes a single transistor and a single diode, and wherein the single transistor includes: the single gate electrode, and one of the plurality of conductive (bit line) contacts, wherein the single diode includes: the first junction region, and a portion of the second junction region where one of the plurality of conductive (bit line) contacts is provided.

The first junction extends along a first line, and wherein the second junction is provided along a sidewall of the first junction.

The second junction is further provided along a bottom of the first junction so that the first junction region is separated from a substrate.

It is to be understood that both the foregoing general description and the following detailed description are exemplary and explanatory and are intended to provide further explanation.

DESCRIPTION OF EMBODIMENTS

Reference will now be made in detail to the embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

An anti-fuse array of a semiconductor device according to embodiments will hereinafter be described with reference to the appended drawings.

The anti-fuse array includes a program transistor and a select transistor. The anti-fuse array receives a voltage through a metal contact connected to each transistor.

If a high voltage is applied to the anti-fuse array through a metal contact coupled to a program gate of a program transistor, a gate insulation film of the program transistor is ruptured. If a predetermined voltage is applied to the anti-fuse array through a metal contact coupled to a select gate of a select transistor, a channel region is formed below the select gate, a voltage flowing through the program gate is applied to the anti-fuse array through the channel region located below the select gate. In order to reduce an area occupied by the program transistor and the select transistor, the anti-fuse array according an embodiment dispenses with one of the program and the select transistors.

A method for forming the anti-fuse array of the semiconductor device according to embodiments will hereinafter be described with reference to FIGS. 1 to 6I.

Figure 1:
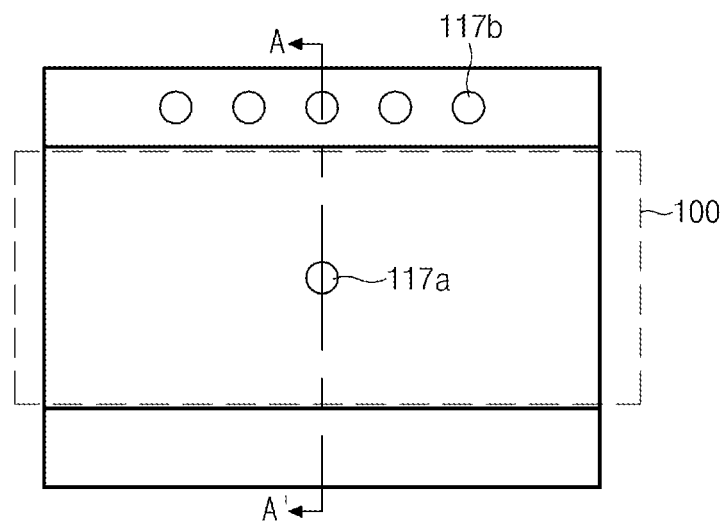
FIG. 1 is a plan view illustrating an anti-fuse array according to an embodiment.
Figure 2:
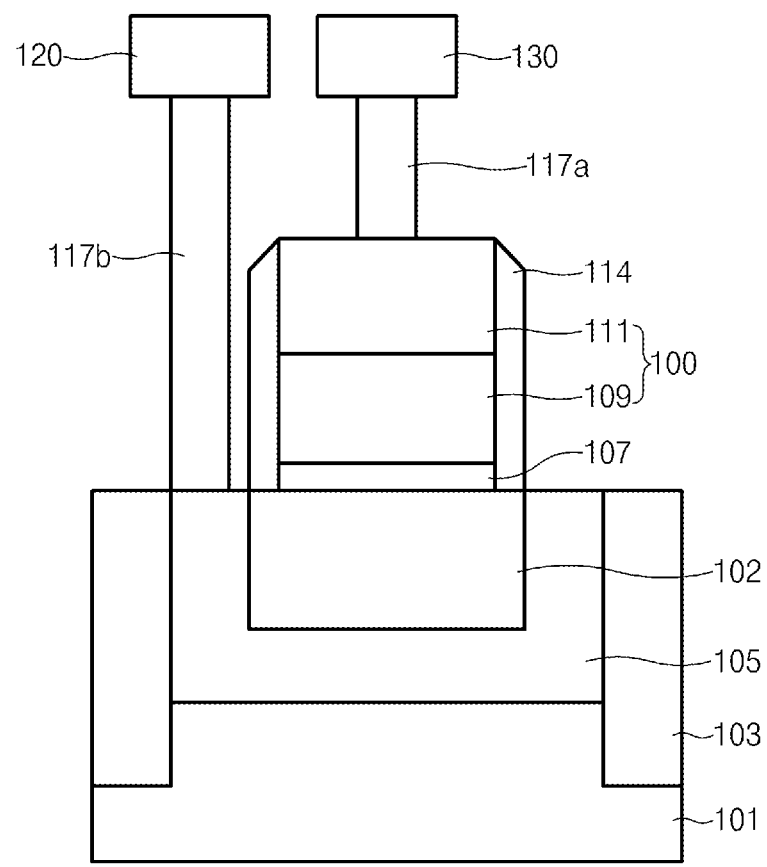
FIG. 2 is a cross-sectional view illustrating an anti-fuse array according to a first embodiment.
Figure 3:
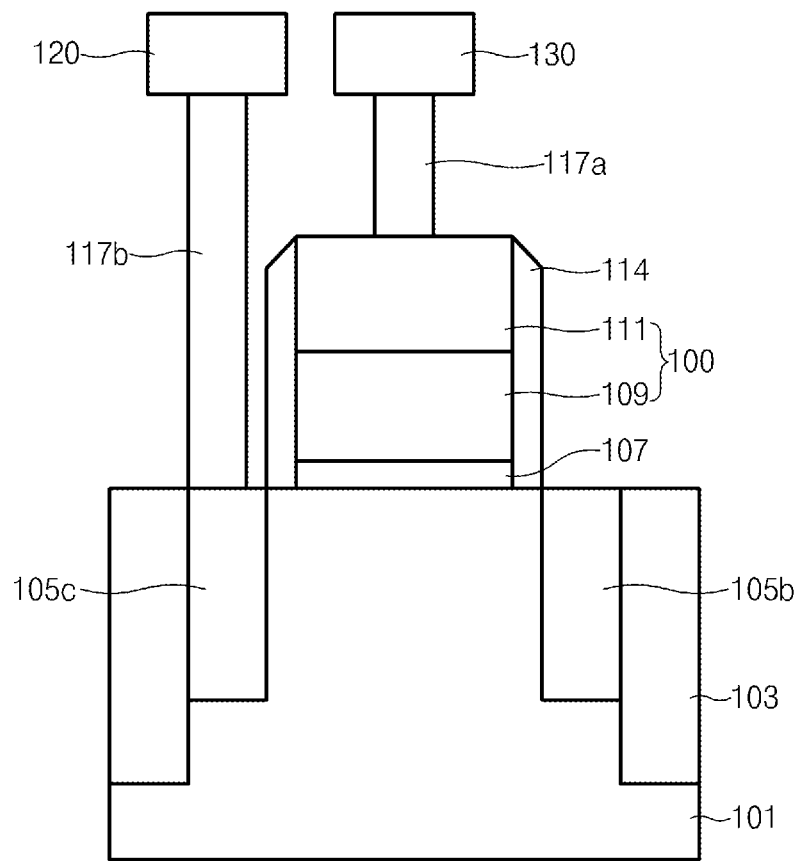
FIG. 3 is a cross-sectional view illustrating an anti-fuse array according to a second embodiment.

FIG. 1 is a plan view illustrating an anti-fuse array according to an embodiment. FIGS. 2 and 3 are cross-sectional views illustrating the semiconductor device taken along the line A-A' of FIG. 1. In more detail, FIG. 2 shows a first embodiment of the anti-fuse array, and FIG. 3 shows a second embodiment of the anti-fuse array.

As can be seen from FIG. 1, the anti-fuse array according to the embodiments may include a line-shaped gate electrode 100 and a plurality of metal contacts (117a, 117b).

Referring to FIG. 2, the anti-fuse array according to the first embodiment includes a U-shaped N-type impurity implantation region 105 formed in an active region defined by a device isolation region 103, and a metal contact 117a coupled to a bit line 120 at an upper part of the N-type impurity implantation region 105. P-type semiconductor substrate 101 is divided into upper and lower parts by the N-type impurity implantation region 105 so that a P-type channel region is formed and a gate electrode 100 is formed over the P-type channel region 102. In this case, the gate electrode 100 may include a laminate structure of a polysilicon film 109 and a tungsten (W) film 111, and a gate insulation film 107 formed below the gate electrode 100. In addition, a metal contact 117a coupled to a word line 130 is formed over the gate electrode 100. If a high voltage is input to the metal contact 117a, the gate insulation film 107 is ruptured. In this case, the gate electrode 100 does not overlap with the N-type impurity implantation region 105. Accordingly, although the gate insulation film 107 is ruptured in a subsequent process, short-circuiting between the gate electrode 100 and the N-type impurity implantation region 105 is prevented from occurring.

In accordance with the first embodiment, the P-type impurity implantation region 102 and the N-type semiconductor substrate 105 coupled to a bit line 120 form a PN junction, such that the PN junction can prevent the occurrence of a leakage current flowing to the semiconductor substrate 101 according to the PN junction theory in which electrons flow from the P-type region to the N-type region.

The anti-fuse array according to a second embodiment will hereinafter be described with reference to FIG. 3. N-type impurity implantation regions (105b, 105c) are formed over the semiconductor substrate 101 in the same manner as in the first embodiment, but the N-type impurity implantation regions (105b, 105c) are formed only at a sidewall of a device isolation region 103 to result in a shape of two parallel lines.

That is, the P-type channel region according to the second embodiment is not separated from the semiconductor substrate 101, whereas the P-type channel region 102 according to the first embodiment is separated from the semiconductor substrate 101.

In accordance with the above embodiments, the word line 130 and the gate electrode 100 are coupled to the P-type channel region 102, and the bit line 120 is coupled to N-type impurity implantation regions (105, 105b, 105c) to form a PN junction (PN diode). Under this configuration, the device according to the embodiments can select the fuse without using a select transistor. A unit cell of the anti-fuse array includes a single transistor 100 and a single diode (PN junction 102, 105)

A method for operating the anti-fuse array according to embodiments will hereinafter be described with reference to FIGS. 4A to 5D. For convenience of description and better understanding, the anti-fuse array shown in FIG. 2 according to the first embodiment will hereinafter be described as an example, but the anti-fuse array according to the second embodiment is operated in the same principles as those of the first embodiment so that a detailed description thereof will herein be omitted.

Figure 4A:
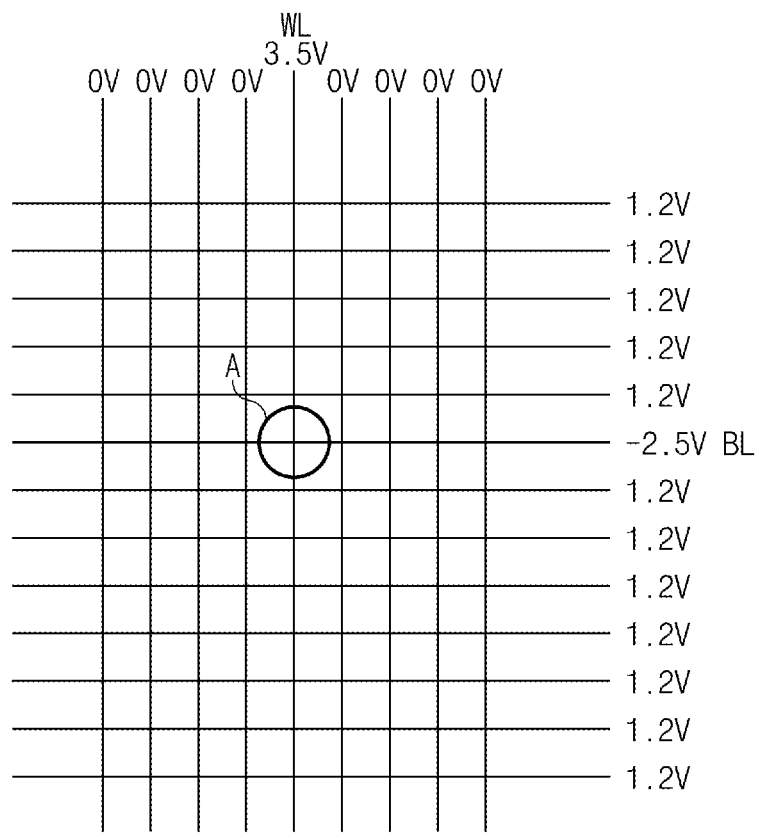
FIGS. 4A and 4B are conceptual diagrams illustrating the operation principles of the anti-fuse array according to embodiments.

FIG. 4A is a conceptual diagram illustrating the program operation principles of the anti-fuse according to embodiments.

Referring to FIG. 4A in which a plurality of word lines WL are formed to cross a plurality of bit lines BL, a voltage of 3.5V is applied to a specific word line from among the plurality of word lines and a voltage of 0V is applied to the remaining word lines. Meanwhile, a voltage of −2.5V is applied to a specific bit line from among the plurality of bit lines, and a voltage of 1.2V is applied to the remaining bit lines. As a result, one fuse (fuse A) is selected for program.

A voltage difference becomes 6V between both ends of the gate insulation film 107 of the selected fuse A, when the word line receives 3.5V and the bit line receives −2.5V. Accordingly, the gate insulation film 107 is ruptured so that the gate electrode 100 is coupled to the P-type channel region 102, resulting in formation of a current path between the word line and the bit line through the selected fuse. In contrast, a voltage of −1.2V or 2.3V is applied to both ends of the gate insulation film 107 of each of the remaining fuses, so that the gate insulation film 107 of each remaining fuses is not ruptured. As described above, the fuse A can be selected and ruptured by the anti-fuse array including one program transistor, but not including a select transistor.

Figure 4B:
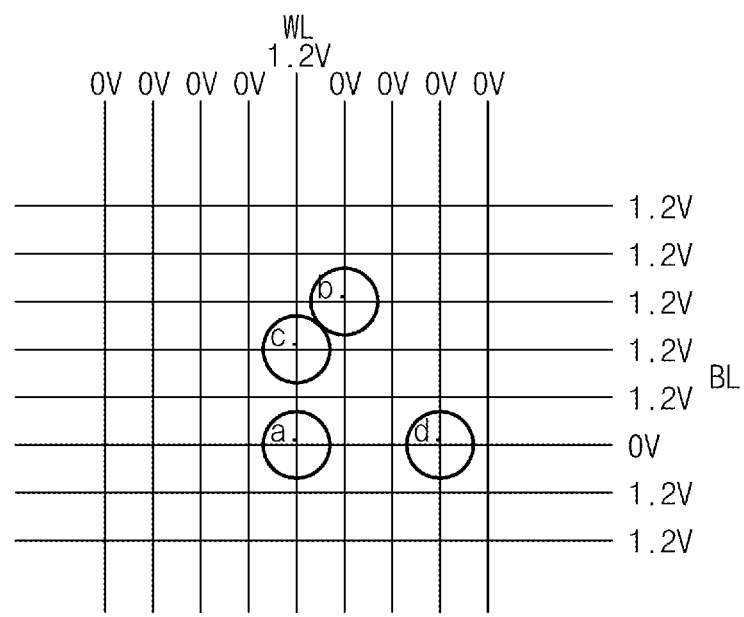

FIG. 4B is a conceptual diagram illustrating the program operation principles of the anti-fuse according to the embodiments.

Referring to FIG. 4B, for the read operation of the anti-fuse array, a voltage of 1.2V is applied to a specific word line from among a plurality of word lines, and a voltage of 0V is applied to the remaining word lines. Meanwhile, a voltage of 0V is applied to a specific bit line from among a plurality of bit lines, and a voltage of 1.2V is applied to the remaining bit lines. As a result, one fuse is selected.

As a result, the anti-fuse array shown in FIG. 4B can be operated in the following four cases 1-4.

TABLE 1

| Case | Point | Bit line | Word line | Operation or non-operation |
|---|---|---|---|---|
| 1 | a | 0 V | 1.2 V | Operation because of PN junction forward. |
| 2 | b | 1.2 V | 0 V | Non-operation because of PN junction reverse |
| 3 | c | 1.2 V | 1.2 V | Non-operation with the same potential |
| 4 | d | 0 V | 0 V | Non-operation with the same potential |

The anti-fuse array was observed during read operations at four points (a, b, c, d) and the result is hereinafter described with reference to FIGS. 5A to 5D and Table 1.

Figure 5A:
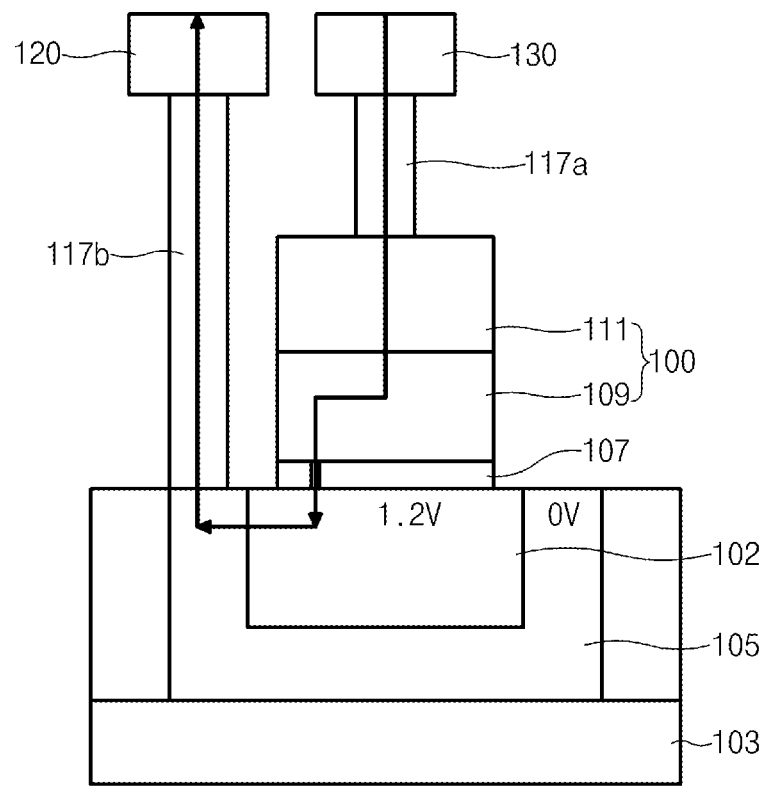
FIGS. 5A to 5D are conceptual diagrams illustrating the operation principles of the anti-fuse array according to embodiments.

Referring to the case 1 of Table 1 and FIG. 5A, a voltage of 0V is applied to a bit line and a voltage of 1.2V is applied to a word line. That is, a voltage of 1.2V is applied to the P-type channel region 102 and a voltage of 0V is applied to the N-type impurity implantation region 105. At the point (a), the gate insulation film 107 is ruptured, and thus PN junction turns on. Thus, a current path from the P-type channel region 102 to the N-type impurity implantation region 105 is formed, so that the read operation can be normally performed.

Figure 5B:
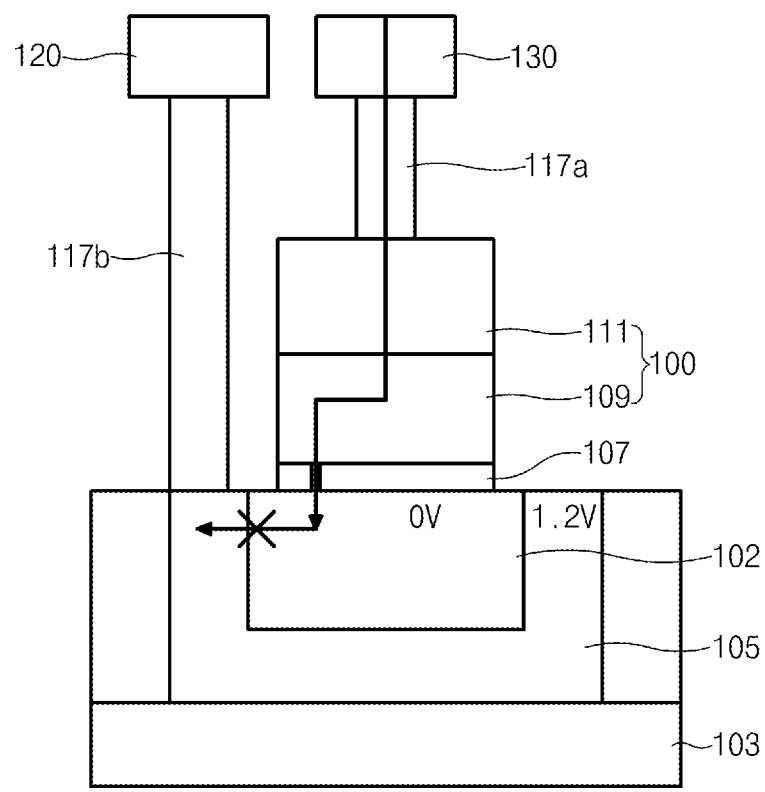

Referring to the case 2 of Table 1 and FIG. 5B, a voltage of 1.2V is applied to the bit line and a voltage of 0V is applied to the word line. That is, a voltage of 0V is applied to the P-type channel region 102 and a voltage of 1.2V is applied to the N-type impurity implantation region 105. The P-type channel region 102 has a lower potential than the N-type impurity implantation region 105 and forms a reverse bias, so that no current path is formed and the read operation is not performed.

Figure 5C:
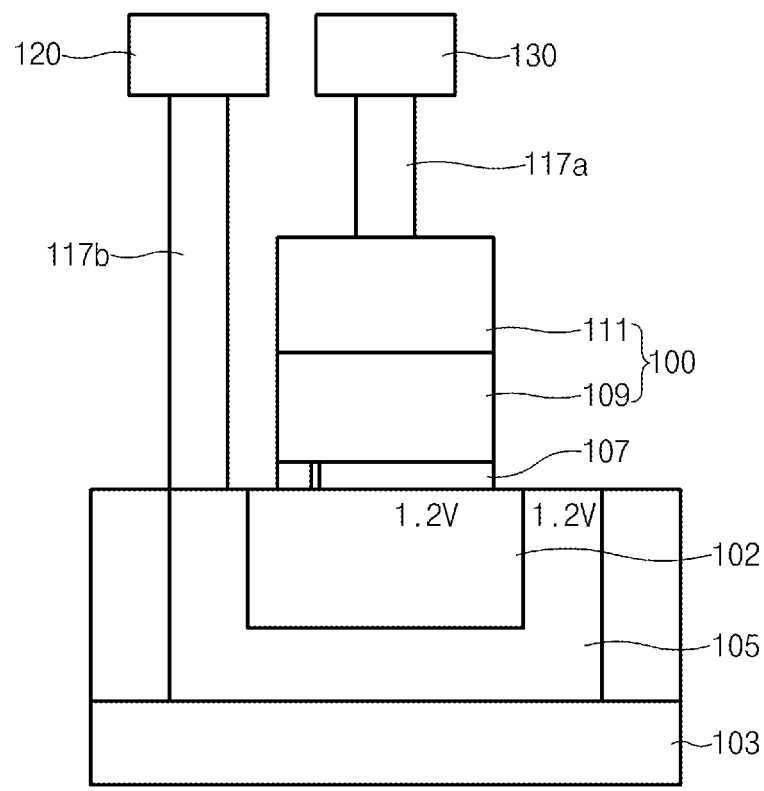

Referring to the case 3 of Table 1 and FIG. 5C, a voltage of 1.2V is applied to the bit line and the voltage of 1.2V is also applied to the word line. That is, the voltage of 1.2V is applied to the P-type channel region 102 and is also applied to the N-type impurity implantation region 105. The P-type channel region 102 has the same potential as the N-type impurity implantation region 105, so that no current path is formed and the read operation is not performed.

Figure 5D:
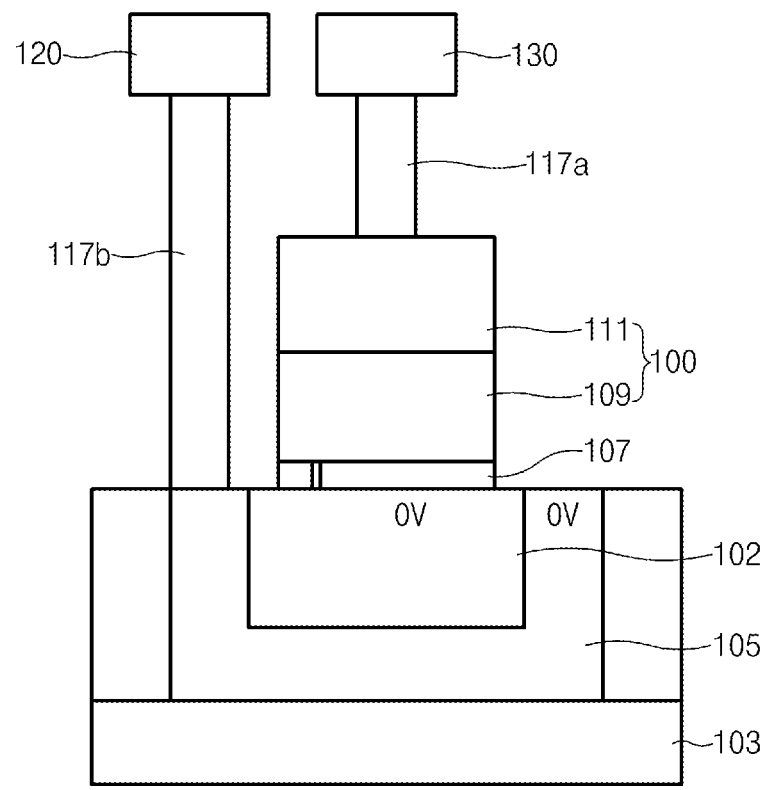

Referring to the case 4 and FIG. 5D, a voltage of 0V is applied to the bit line and the voltage of 0V is applied to the word line. That is, a voltage of 0V is applied to the P-type channel region 102 and is also applied to the N-type impurity implantation region 105. The P-type channel region 102 has the same potential as the N-type impurity implantation region 105, so that no current path is formed and the read operation is not performed.

As described above, since the N-type impurity implantation region 105 is formed in the active region and along a boundary of the channel region 102, it is possible to select a specific fuse without a select transistor.

A method for forming the anti-fuse according to the first embodiment will hereinafter be described with reference to FIGS. 6A to 6I.

Figure 6A:
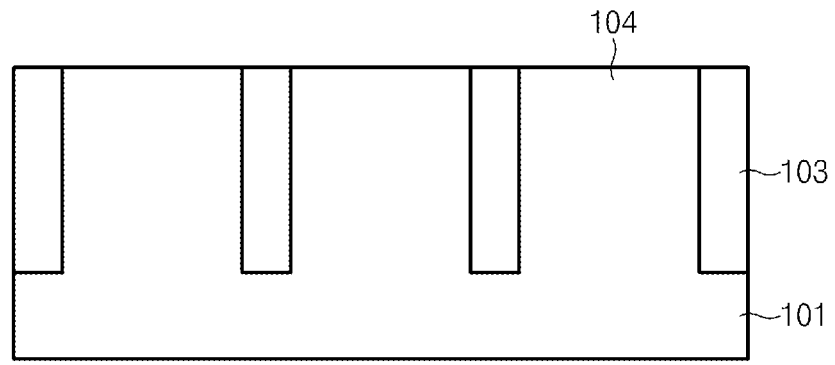
FIGS. 6A to 6I are cross-sectional views illustrating a method for forming the anti-fuse array according to the first embodiment.

Referring to FIG. 6A, a device isolation region 103 is formed over the P-type semiconductor substrate 101 such that the active region 104 is defined.

Figure 6B:
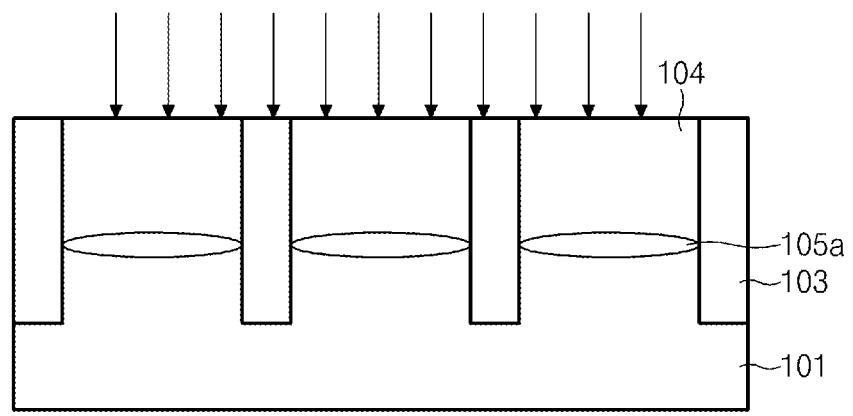

Referring to FIG. 6B, N-type impurities are implanted into the active region 104 so that the N-type impurity implantation region 105a is formed. The N-type impurity implantation region 105a is formed in the active region 104 disposed between the device isolation regions 103.

Figure 6C:
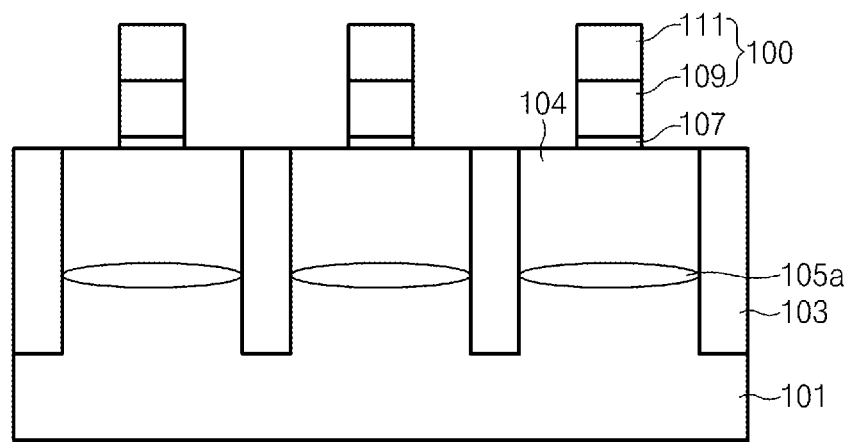

Referring to FIG. 6C, insulation materials, polysilicon, and tungsten are sequentially deposited over the semiconductor substrate 101, and are etched using a photoresist film (not shown) as a mask to form a gate pattern in which a gate insulation film 107, a polysilicon film 109, and a tungsten film 111 are sequentially deposited. The polysilicon film 109 and the tungsten (W) film 111 are used as the gate electrode 100. In this case, the gate insulation film 107 and the gate electrode 100 are formed over the active region 104.

Figure 6D:
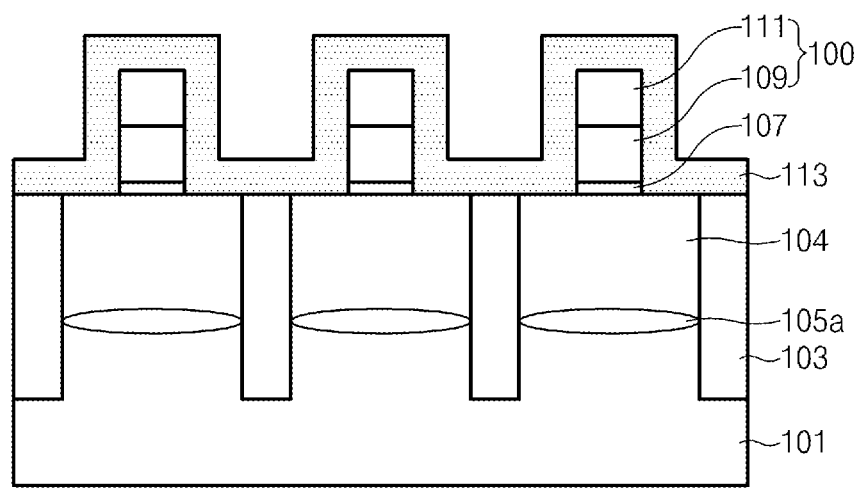

Referring to FIG. 6D, a gate spacer material 113 is deposited over the entire surface of the gate electrode 100 and the semiconductor substrate 101.

Figure 6E:
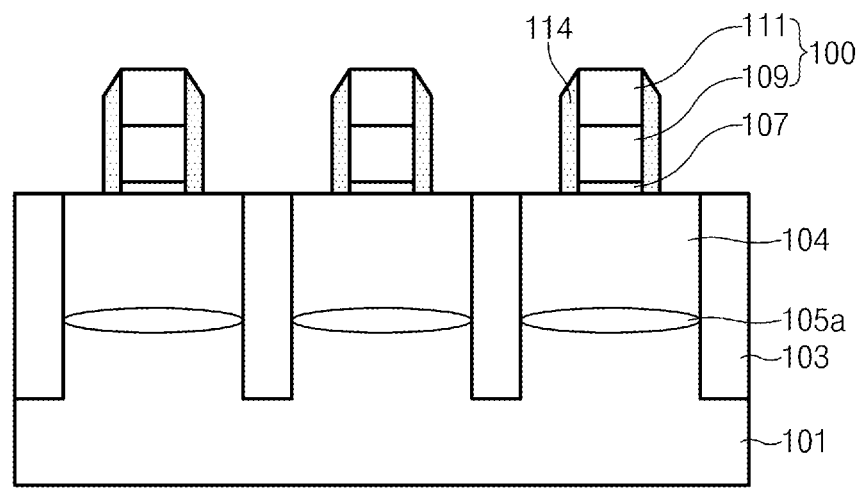

Referring to FIG. 6E, a gate spacer material 113 is etched so that a gate spacer film 114 is formed over sidewalls of the gate electrode 100 and the gate insulation film 107.

Figure 6F:
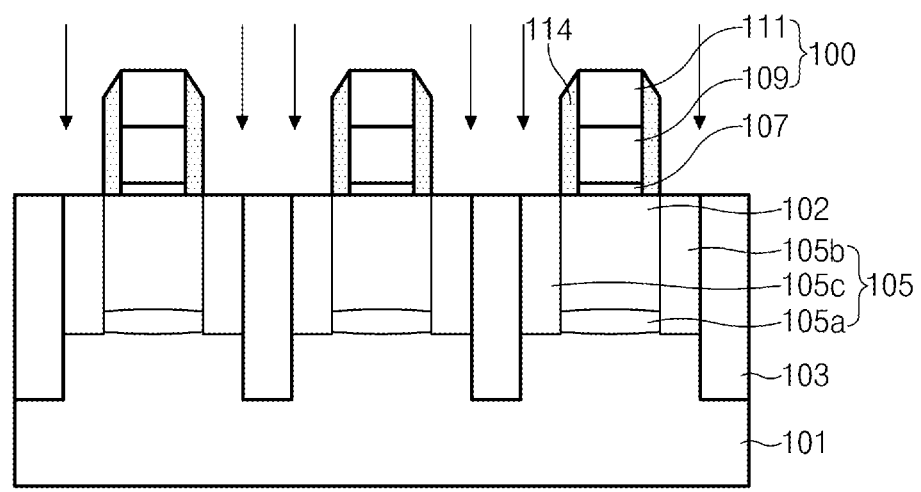

Referring to FIG. 6F, N-type impurities are implanted into the active region 104 using the gate electrode 100 as a mask, such that N-type impurity implantation regions (105b, 105c) are formed in the active region between the device isolation region 103 and the gate electrode 100. As a result, the N-type impurity implantation regions (105a, 105b, 105c) are configured in the form of U shape. For convenience of description, the N-type impurity implantation regions (105a, 105b, 105c) will hereinafter be referred to as one reference number 105.

Figure 6G:
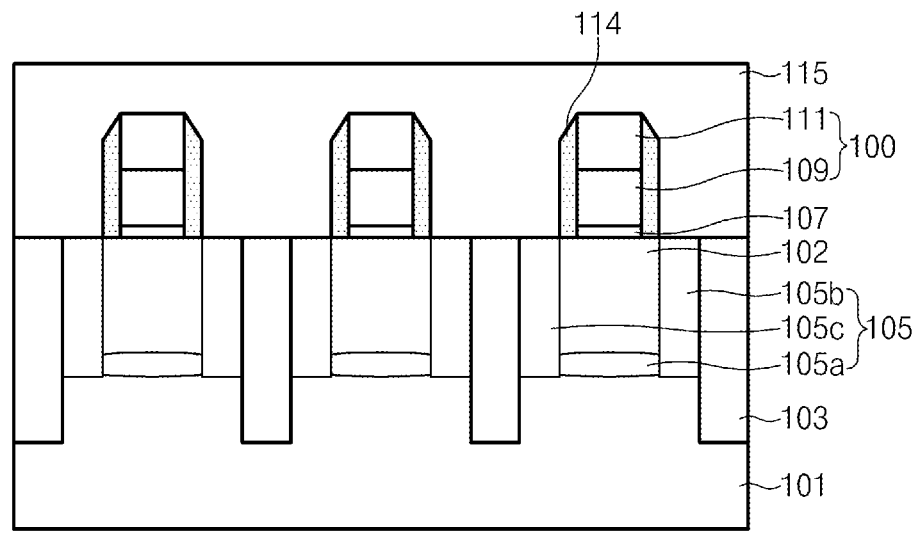

Referring to FIG. 6G, an interlayer insulation film 115 having a higher height than the gate electrode 100 is deposited over the entire surface of the semiconductor substrate 101 including the gate electrode 100.

Figure 6H:
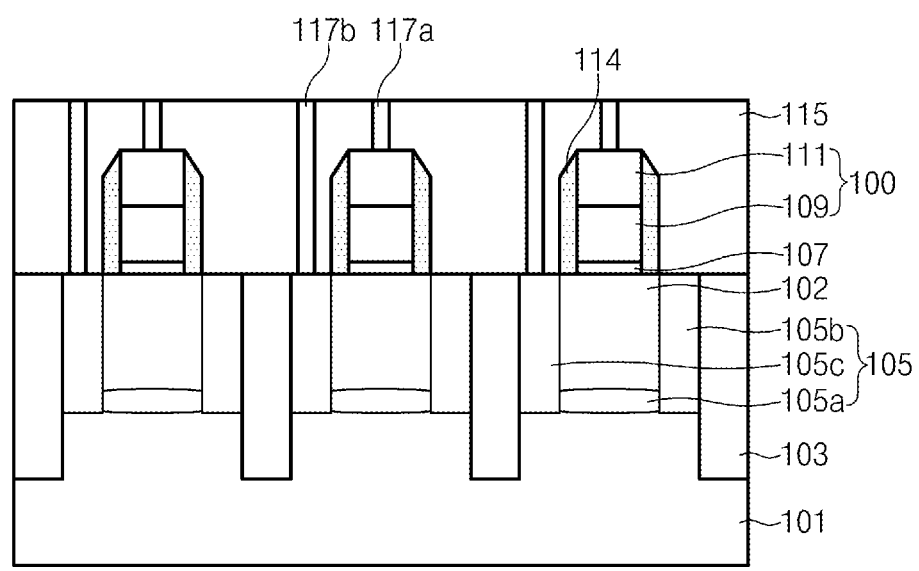

Referring to FIG. 6H, the interlayer insulation film 115 is etched, metal contact holes (not shown) is formed to expose the gate electrode 100 and the N-type impurity implantation region 105, respectively. A conductive material is deposited in the metal contact holes (not shown), resulting in formation of the metal contacts (117a, 117b).

Figure 6I:
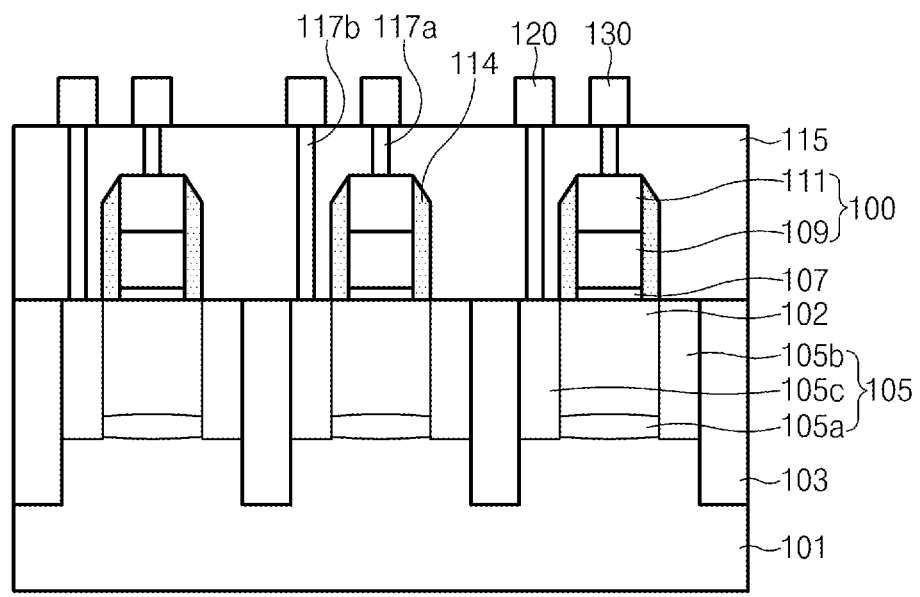

Referring to FIG. 6I, metal lines (120, 130) are formed over the metal contacts (117a, 117b) to provide voltages, and the word line 130 is formed over the metal contact 117a and the bit line 120 is formed over the metal contact 117b.

FIGS. 6A to 6I are conceptual diagrams illustrating a method for forming the U-shaped N-type impurity region 105 according to the first embodiment. In contrast, according to a method for forming the N-type impurity implantation regions (105b, 105c) formed only at a sidewall of the device isolation region 103 according to the second embodiment, after the process of FIG. 6A is performed, the process for forming the N-type impurity region 105a of FIG. 6B is omitted, and the remaining processes of FIGS. 6C to 6I are then performed, as such a detailed description thereof will be omitted herein.

As described above, in case of the semiconductor device according to embodiments, the N-type impurity implantation region 105 is formed in the active region of the semiconductor substrate 101, and the P-type channel region 102 separated from the semiconductor substrate 101 is formed, resulting in formation of a PN junction. As a result, the semiconductor device can operate like the anti-fuse array using only one transistor.

In addition, the P-type channel region 102 is separated from the P-type semiconductor substrate 101 using the N-type impurity implantation region 105, and the P-type semiconductor substrate 101 and the N-type impurity implantation region 105 can form the PN junction, such that the PN junction can prevent a leakage current from flowing in the P-type semiconductor substrate 101.

As is apparent from the above description, the anti-fuse array may be comprised of one transistor so that the area of the anti-fuse array can be minimized.

Those skilled in the art will appreciate that embodiments may be carried out in other specific ways than those set forth herein without departing from the spirit and essential characteristics of the present invention. The above exemplary embodiments are therefore to be construed in all aspects as illustrative and not restrictive. Embodiments should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an exemplary embodiment or included as a new claim by a subsequent amendment after the application is filed.

The above embodiments are illustrative and not limitative. Various alternatives and equivalents are possible. The invention is not limited by the type of deposition, etching polishing, and patterning steps described herein. Nor are embodiments limited to any specific type of semiconductor device. For example, embodiments may be implemented in a dynamic random access memory (DRAM) device or non volatile memory device. Other additions, subtractions, or modifications fall within the scope of the appended claims.

What is claimed is:

1. A method for manufacturing an anti-fuse array of a semiconductor device comprising:
   forming an active region in a first-type semiconductor substrate by a device isolation region;
   forming a second-type first impurity implantation region in a lower portion of the active region;
   depositing a gate insulation film and a gate electrode over the active region;
   forming a spacer film over a sidewall of the gate electrode;
   forming second-type second and third impurity implantation regions, using the gate electrode and the spacer film as a mask, in the active region and along a sidewall of the device isolation region; and forming a first metal contact over the second impurity implantation region,
wherein an upper portion of the active region includes a first-type channel region separated from the semiconductor substrate by the first, second, and third impurity implantation regions.

2. The method according to claim 1, wherein the first impurity implantation region extends perpendicular to the second and third impurity implantation regions in the active region and is disposed between the second and third impurity implantation regions.

3. The method according to claim 1, further comprising:
forming a second metal contact over the gate electrode;
forming a bit line coupled to the first metal contact; and
forming a word line coupled to the second metal contact.

4. The method according to claim 3, wherein the second metal contact is formed simultaneously with the first metal contact.

5. The method according to claim 4, wherein the forming of the first and the second metal contacts includes:
depositing an interlayer insulation film over the gate electrode and the semiconductor substrate;
forming a first metal contact hole exposing the second impurity implantation region by etching the interlayer insulation film;
forming a second metal contact hole exposing an upper part of the gate electrode by etching the interlayer insulation film; and
forming the first metal contact and the second metal contact by filling a conductive material in the first metal contact hole and the second metal contact hole.

6. The method according to claim 1, wherein the gate electrode does not overlap with the second and third impurity implantation regions.

7. The method according to claim 1, wherein the first type is P type, and the second type is N type.

8. The method according to claim 1, wherein the first, second, and the third impurity regions are formed as a U-shape.

9. The method according to claim 3, when the gate insulation film is ruptured by a potential difference applied to the first metal contact and the second metal contact, a PN junction between the second-type impurity implantation regions and the active region formed below the gate electrode is formed.

10. The method according to claim 1, wherein the spacer film is disposed over a sidewall of the gate insulation film.

* * * * *